(12) United States Patent
Kostka et al.

(10) Patent No.: US 8,253,329 B2
(45) Date of Patent: Aug. 28, 2012

(54) ENHANCED EDGE SEAL DESIGN FOR ORGANIC LIGHT EMITTING DIODE (OLED) ENCAPSULATION

(75) Inventors: James Michael Kostka, Mayfield Heights, OH (US); Andrew Scott Albrecht, Shaker Heights, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/691,674

(22) Filed: Jan. 21, 2010

(65) Prior Publication Data

US 2011/0175523 A1    Jul. 21, 2011

(51) Int. Cl.
*H01J 1/62*    (2006.01)
(52) U.S. Cl. .......................................... 313/512
(58) Field of Classification Search ............... 313/512
See application file for complete search history.

(56) References Cited

U.S. PATENT DOCUMENTS

| | | | |
|---|---|---|---|
| 6,891,330 B2 | 5/2005 | Duggal et al. | |
| 7,015,640 B2 | 3/2006 | Schaepkens et al. | |
| 2002/0068191 A1 | 6/2002 | Kobayashi | |
| 2002/0125817 A1* | 9/2002 | Yamazaki et al. | 313/498 |
| 2004/0195967 A1* | 10/2004 | Padiyath et al. | 313/512 |
| 2005/0225234 A1 | 10/2005 | Tyan et al. | |
| 2005/0274630 A1* | 12/2005 | Clark et al. | 206/1.5 |
| 2006/0278965 A1 | 12/2006 | Foust et al. | |
| 2009/0302760 A1* | 12/2009 | Tchakarov et al. | 313/512 |

FOREIGN PATENT DOCUMENTS

JP    5 242966 A    9/1993

OTHER PUBLICATIONS

*TCP-0814 High Barrier, Flexible Packaging Lamination*, Technical Product Data sheet, Tolas Healthcare Packaging, An Oracle Packaging Company, Feastervill, PA, (Jul. 2008).
International Search Report and Written Opinion, PCT/US2010/062352, mailed Jul. 14, 2011.

* cited by examiner

*Primary Examiner* — Anh Mai
*Assistant Examiner* — Andrew Coughlin
(74) *Attorney, Agent, or Firm* — Fay Sharpe LLP

(57) ABSTRACT

A light source assembly and associated method of forming same includes a generally planar light emitting device having parallel first and second generally planar surfaces that are interconnected along a perimeter. A seal extends over at least a portion of the light emitting device. Further, a sidewall portion encloses the perimeter of a light emitting device, and a cover portion may extend over at least a portion of the light emitting device. The method includes folding perimeter edges of an enlarged backsheet, or providing a frame seal that is dimensioned so that perimeter edges may be folded over the light emitting device.

18 Claims, 4 Drawing Sheets

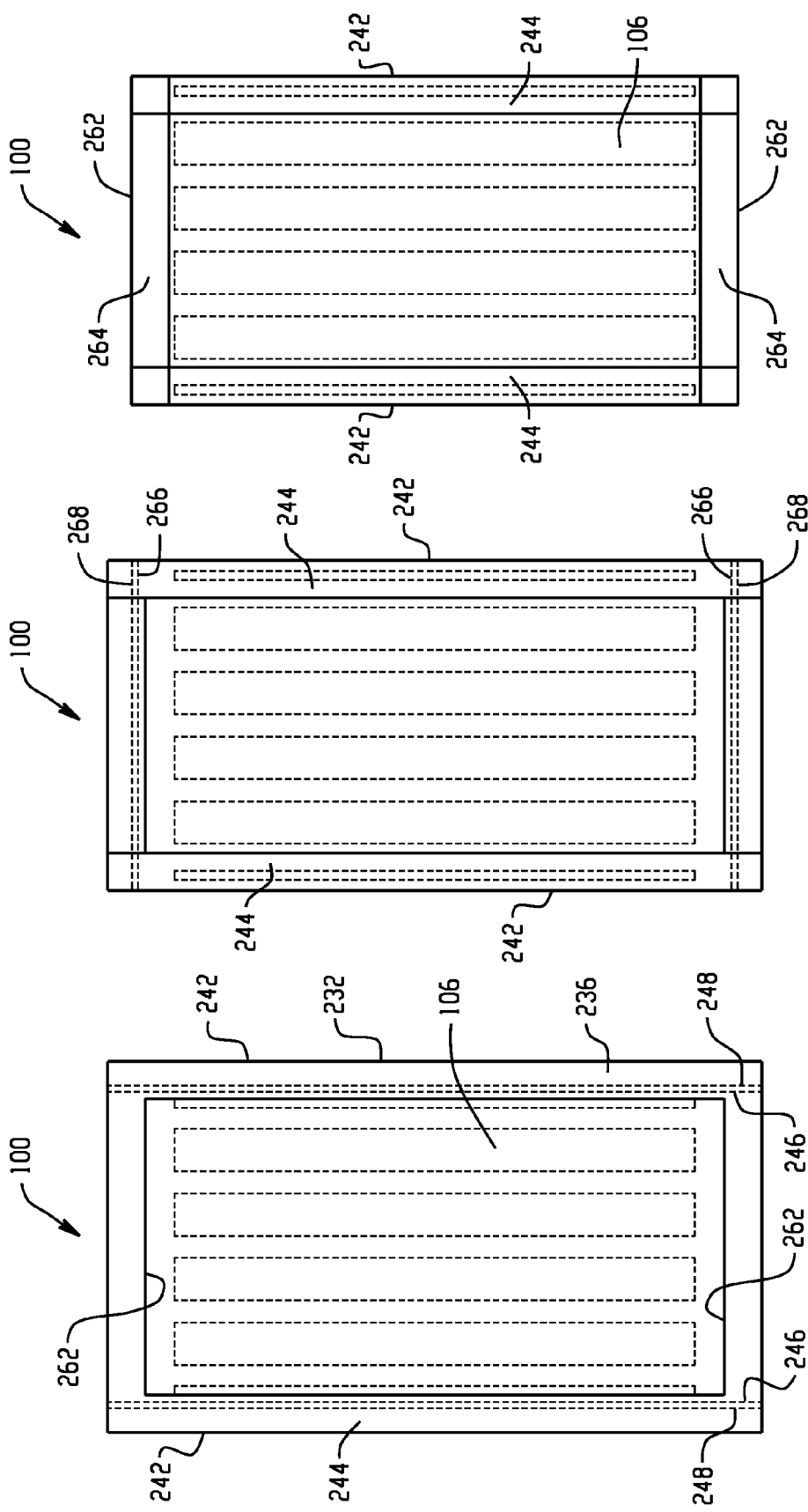

ENHANCED EDGE SEAL DESIGN FOR ORGANIC LIGHT EMITTING DIODE (OLED) ENCAPSULATION

BACKGROUND OF THE DISCLOSURE

The present disclosure relates to a light source, and particularly a seal for a light source of the type that uses a generally planar light emitting device such as an organic light emitting diode device or panel.

Organic light emitting diode devices, or OLED devices are generally known in the art. An OLED device typically includes one or more organic light emitting layer(s) disposed between electrodes. For example, first and second contacts, such as a cathode and a light transmissive anode are formed on a substrate. Light is emitted when current is applied across the cathode and anode. As a result of the electric current, electrons are injected into the organic layer from the cathode and holes may be injected into the organic layer from the anode. Electrons and holes generally travel through the organic layer until they recombine at a luminescent center, typically an organic molecule or polymer. The recombination process results in the emission of a light photon usually in the visible region of the electromagnetic spectrum.

The layers of an OLED are typically arranged so that the organic layers are disposed between the cathode and anode layers. As photons of light are generated and emitted, the photons move through the organic layer. Those that move toward the cathode, which generally comprises a metal, may be reflected back into the organic layer. Those photons that move through the organic layer to the light transmissive anode, and finally to the substrate, however, may be emitted from the OLED in the form of light energy. Some cathode materials may be light transmissive, and in some embodiments light may be emitted from the cathode layer, and therefore from the OLED device in a multi-directional manner. Thus, the OLED device has at least a cathode, organic, and anode layers. Of course, additional, optional layers may or may not be included in the light source structure.

Cathodes generally comprise a material having a low work function such that a relatively small voltage causes the emission of electrons. Commonly used materials include metals, such as gold, gallium, indium, manganese, calcium, tin, lead, aluminum, silver, magnesium, lithium, strontium, barium, zinc, zirconium, samarium, europium, and mixtures of alloys of any two or more thereof. On the other hand, the anode layer is generally comprised of a material having a high work function value, and these materials are known for use in the anode layer because they are generally light transmissive. Suitable materials include, but are not limited to, transparent conductive oxides such as indium tin oxide (ITO), aluminum doped zinc oxide (AZO), fluorine doped tin oxide (FTO), indium doped zinc oxide, magnesium indium oxide, and nickel tungsten oxide; metals such as gold, aluminum, and nickel; conductive polymers such as poly(3,4-ethylenedioxythiophene) poly(styrenesulfonate) (PEDOT:PSS); and mixtures and combinations or alloys of any two or more thereof.

The OLED devices can be mounted on a rigid substrate such as glass or are generally flexible, i.e., are capable of being bent into a shape having a radius of curvature. In some instances, the OLED devices are coupled together to form a flexible, generally planar OLED panel comprised of one or more OLED devices. Such a panel has a large surface area of light emission.

Oxygen and moisture are particularly deleterious to an OLED structure. The intrusion of oxygen or moisture into the OLED device results in dark spots, decreased illumination, etc. It is important, therefore, to create a hermetic package around the OLED panel to limit the potential for ingress of oxygen, moisture, etc. A particular area of concern is along the perimeter edge of the OLED device or panel where laminate edges of adjacent layers of the structure of the OLED device are potentially exposed and possibly subject to oxygen and/or moisture ingress.

Presently, a barrier material is provided on one or both of the first or upper and second or lower surfaces of the OLED device or panel. Accommodations are made to seal the peripheral portions of the first and second surfaces in an effort to prevent moisture and/or oxygen from reaching the functional materials of the OLED device. This often requires compatibility of the barrier materials with the materials of the OLED device in an effort to seal the first and second surfaces adjacent the edge.

A need exists to provide an effective edge seal to maximize illumination efficiency, and increase useful life of an OLED device or panel.

SUMMARY OF THE DISCLOSURE

An enhanced edge seal design for a generally planar light source assembly, such as an OLED panel, and a method of sealing such a light source assembly are disclosed herein.

A preferred light source assembly includes a flexible, generally planar light emitting device having parallel first and second generally planar surfaces interconnected by a perimeter. A seal extends over at least a portion of the first surface of the light emitting device, and includes a sidewall portion that encloses the perimeter of the light emitting device.

The seal includes a cover portion that extends inwardly from the sidewall portion over the second surface of the light emitting device in another preferred arrangement.

The seal may be an impermeable backsheet that supports the second surface of the light emitting device or alternatively the seal has a central opening that substantially matches a light emitting portion of the first surface.

An adhesive may be interposed between the backsheet and the light emitting device along the perimeter and/or along the first and second surfaces adjacent the perimeter.

The seal may be formed of a material that includes a moisture absorbing material.

A method of sealing a flexible, generally planar light source includes providing a flexible, generally planar light source having an outer perimeter, providing an impermeable bendable material having a second outer perimeter conformation greater than the light source perimeter, positioning the bendable material relative to the light source such that the perimeter of the bendable material extends beyond the light source perimeter, and folding the bendable material over the perimeter of the light source.

The method may further include adhesively securing the bendable material to the light source.

In a preferred arrangement, the light source has a quadrilateral configuration, and the folding step includes folding the bendable material over a first set of opposite, parallel edges and subsequently folding the bendable material over a second set of opposite, parallel edges.

A primary benefit of the present disclosure is that the proposed seal effectively doubles the edge seal width.

Another benefit resides in the improved mechanical stability.

Still another advantage is associated with preventing delamination.

Yet another advantage relates to increased adhesive options as a result of the external seal.

Still other benefits and advantages of the present disclosure will become apparent from reading and understanding the following detailed description.

BRIEF DESCRIPTION OF THE DRAWINGS

FIG. 8 is a plan view of the second or rear surface of the light source assembly of FIG. 1 positioned centrally within the seal of FIG. 6.

FIG. 9 is a plan view of the rear surface of the light source assembly with the first set of opposite edges of the frame seal folded on the rear surface of the light emitting device.

FIG. 10 is a plan view of the rear surface of the light source assembly with the second set of opposite edges folded over the second surface of the light emitting device.

DETAILED DESCRIPTION OF THE PREFERRED EMBODIMENTS

Figure 3:
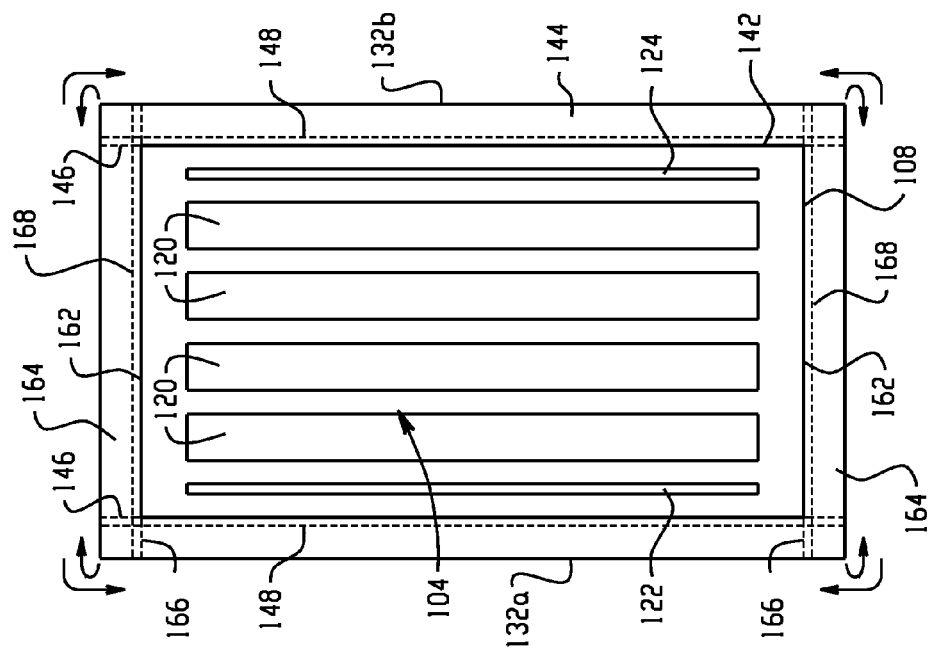
FIG. 3 shows the light emitting device of FIG. 1 substantially centrally positioned on the seal of FIG. 2.
Figure 2:
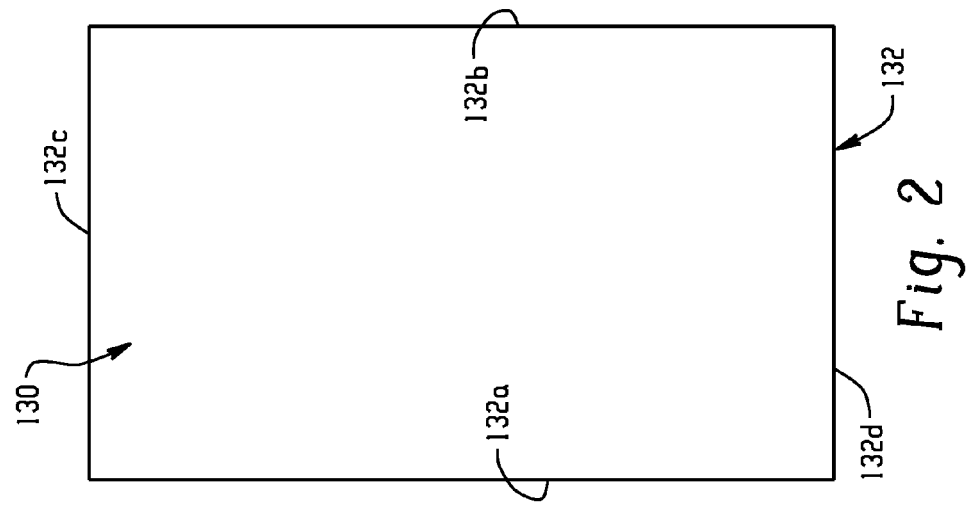
FIG. 2 is a plan view of one preferred form of seal prior to assembly on the light emitting device.
Figure 1:
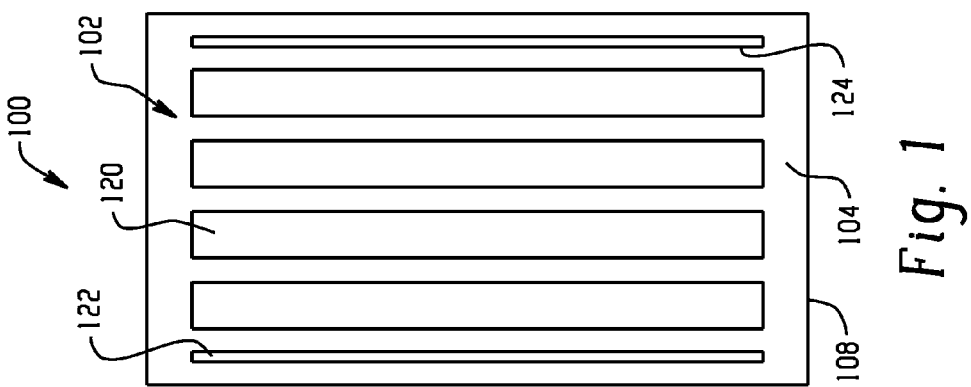
FIG. 1 is a plan view of a generally planar light emitting device, particularly illustrating a first light emitting surface thereof.
Figure 4:
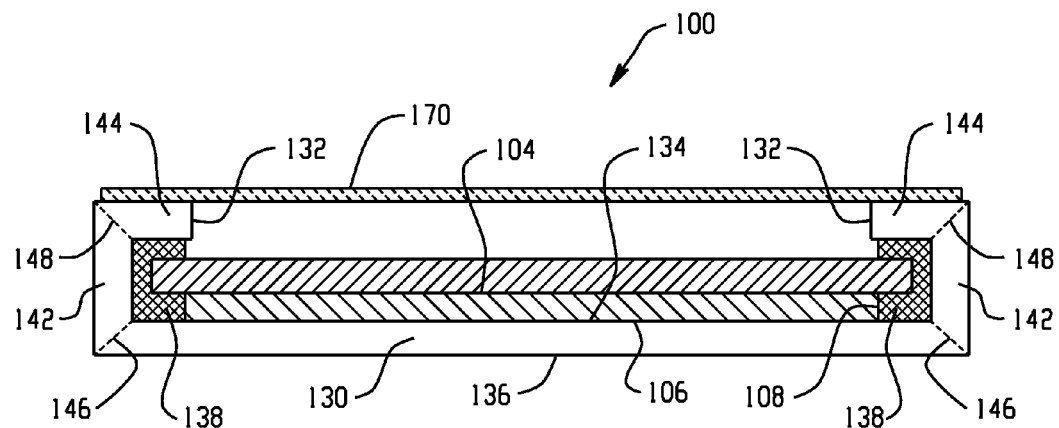
FIG. 4 is a cross-sectional view through the light assembly with the edge seal formed by folding the backsheet on to perimeter edges of the light emitting surface.

With initial reference to FIGS. 1-5, a first embodiment of a generally planar light source assembly 100 is shown. The assembly includes a generally planar light emitting device 102, which in a preferred embodiment is an organic light emitting diode (OLED) device that has first (front) and second (rear) generally planar surfaces 104, 106 interconnected by a perimeter or edge 108 (FIG. 4). The OLED device 102 is preferably a flexible structure, thin, and may be comprised of one or more light emitting elements, 120, four of which are illustrated in FIG. 1 in substantially parallel relation with a first contact or anode bus bar 122 and a second contact or cathode bus bar 124 preferably disposed at opposite edges of the light emitting device 102 that allow electrical connections to be made with the OLED device along the perimeter (FIGS. 1 and 3). In the exemplary embodiment, one of the contacts is an anode while the other contact is a cathode, although it will be appreciated that in other embodiments these contacts could all be anode contacts and the cathode contact located in the back of the elements. Thus continuing reference to either an anode or cathode should not be deemed limiting.

A generally planar backplane or backsheet 130 (FIG. 2) has a slightly larger perimeter or edge 132 than the associated perimeter 108 of the light emitting device 102. This is preferably the case around the entire perimeter for reasons which will become more apparent below. It will also be appreciated that the light emitting device 102 and the associated backsheet 130 have a quadrilateral configuration in the preferred embodiment namely because such a configuration is useful in many circumstances and easy to manufacture. However, the present disclosure should not be deemed limited to such a configuration of either the light emitting device, backsheet, or the resultant generally planar light source assembly 100. The backsheet 130 serves to support the light emitting device along the second or rear surface 106 and, depending on its structure, can also serve as the seal as will become more apparent from the following description.

Preferably, the backsheet is formed from an impermeable material that is bendable or foldable, for example a foil or film construction that exhibits excellent moisture, and oxygen barrier characteristics is one preferred material. One example of a commercially available, laminate type of backsheet is a TPC-0814B High Barrier, Flexible Packaging Lamination sold by Tolas Healthcare Packaging, although such a backsheet or barrier layer is merely representative of one type of material that can be used. Oftentimes, the impermeable backsheet is a laminate that includes a metal foil such as aluminum or the like that is encapsulated in a polymer insulator.

An ultrahigh barrier (UHB) 140 (FIG. 4) that is also impermeable to moisture and oxygen, but is preferably light transmissive, may be used to cover the upper, first surface 104 of the OLED panel. The UHB is generally known in the art, and particular details of the structure and function of the UHB are shown and described in commonly owned U.S. Pat. No. 7,015,640. It will be further appreciated that the OLED can be manufactured on the barrier film itself.

Extending inwardly from the perimeter of the backsheet 130, and disposed on surface 134 that faces the OLED panel, and opposite the second surface 136 that faces outwardly to the external environment is an adhesive 138. The adhesive is preferably of a width that extends inwardly from the perimeter edge 132 to enhance the mechanical bond between the backsheet and the edge portions of the first and second generally planar surfaces 104, 106 of the OLED panel. Alternatively, if an ultrahigh barrier 140 is used, the adhesive may mechanically secure and aid in sealing properties with the ultrahigh barrier as shown in FIG. 4.

Once the light emitting device 102 is positioned on the backsheet 130 (FIG. 3), perimeter edges of the backsheet are folded over the perimeter 108 of the OLED device and thus form a sidewall portion 142 that covers or encapsulates the edge, as well as a cover portion 144 that is received over the portion of the first surface 104 adjacent the perimeter (FIG. 4). This is achieved by bending or folding the backsheet along a first fold line 146 and then again along a second fold line 148. These fold lines are represented in spaced relation in FIGS. 3 and 4, although it will be appreciated that due to the thin nature of the light emitting device, the spacing between the fold lines 146, 148 is exaggerated for ease of illustration and understanding. The region of the backsheet between the fold lines 146, 148 forms the sidewall portion 142 that encloses the perimeter edge of the OLED. Cover portion 144, on the other hand, is generally defined between the second fold line 148 and the outer perimeter or terminal edge 132 of the backsheet. In a similar manner, sidewall portions 162 and cover portions 164 are formed by first and second fold lines 166, 168 that are again shown in exaggerated form in FIG. 3, and cover the second pair of edges of the quadrilateral configuration of the generally planar light source assembly.

The adhesive preferably extends between a perimeter portion of the first or inner surface of the backsheet, along the sidewall portions 142, 162, and along the interior of the cover portion 144, 164. In this manner, the folded over backsheet forms an enhanced edge seal having a width that is effectively doubled by folding over the extended edges of the backsheet in this first preferred embodiment. Although there will be a double fold or double thickness in the extreme corner regions of the light source assembly (FIG. 3), the reduced thickness of the backsheet and use of the adhesive still provides for the desired flexibility and conformability of the light source assembly.

An outcoupling film 170 (FIG. 4) may be placed on top of the seal, i.e., on the outer surfaces of the cover portions 144, 164. As one skilled in the art recognizes, the outcoupling film can be utilized to extract light that is trapped in the waveguided mode within the substrate. These films typically consist of scattering particles, or surface texturing such as micro lenses or prisms, which increase the amount of light emitted from the device. Such a location of the outcoupling film 170 also advantageously prevents de-lamination and catastrophic failure of the assembly. Alternatively, the film 170 could be located beneath the cover portions 144, 164.

Figure 5:
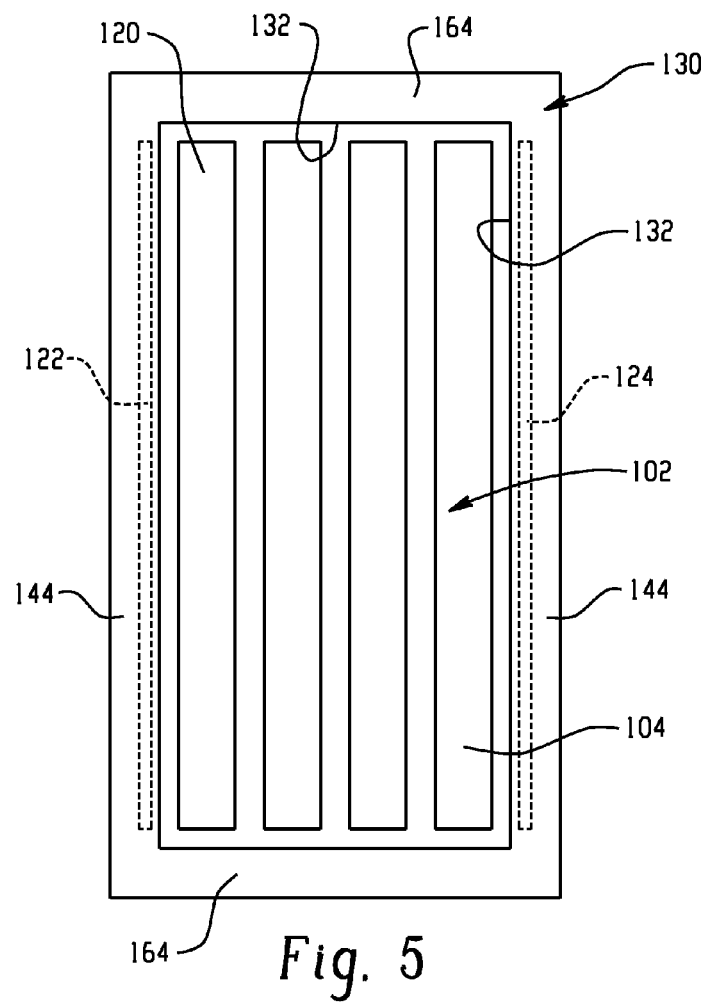
FIG. 5 is a view of the light emitting surface of the light source assembly after completing the edge seal design.

As evident in FIG. 5, the light emitting portion 102 of the first surface 104 of the light emitting device is still open to the exterior and unblocked by the perimeter seal formed by folding over perimeter edges of the impermeable backsheet. The first contact 122 and the second contact 124 are covered by the cover portions 144, 164 of the backsheet that is folded over onto the first surface 102 of the OLED panel.

Figure 7:
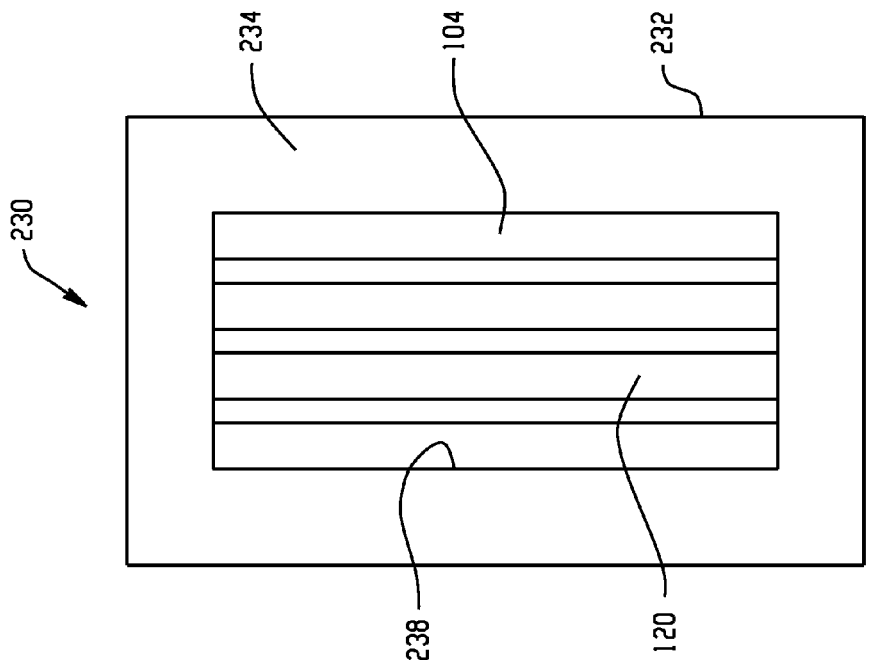
FIG. 7 illustrates the position of the frame seal of FIG. 6 over the light emitting surface of the light source assembly of FIG. 1.

FIGS. 6-10 illustrate a second embodiment of the disclosure, which shares many similar features to that of the embodiment of FIGS. 1-5. Here, seal 230 is a frame-like or open-centered structure that has an outer perimeter or edge 232 that extends between first (front) and second (rear) opposed surfaces 234, 236 and an inner perimeter/edge that forms a central opening 238. The frame material is preferably formed from an impermeable material that is bendable or foldable, for example a foil or film construction that exhibits excellent moisture, and oxygen barrier characteristics. The central opening 238 is dimensioned to mate with the dimension of the light emitting portion of the first surface 104 of the light emitting device (FIG. 7), i.e., the frame seal covers those portions of the light emitting surface 104 adjacent the perimeter. Thus, the first surface 104 of the light emitting device is positioned adjacent the second or rear surface 236 of the frame seal 230 and positioned in a manner such as shown in FIG. 7 to align the light emitting portions of the first surface 104 with the central opening 238. Preferably, the abutting surfaces are adhesively secured together in substantially the same manner as described with respect to the embodiment of FIGS. 1-5.

Figure 6:
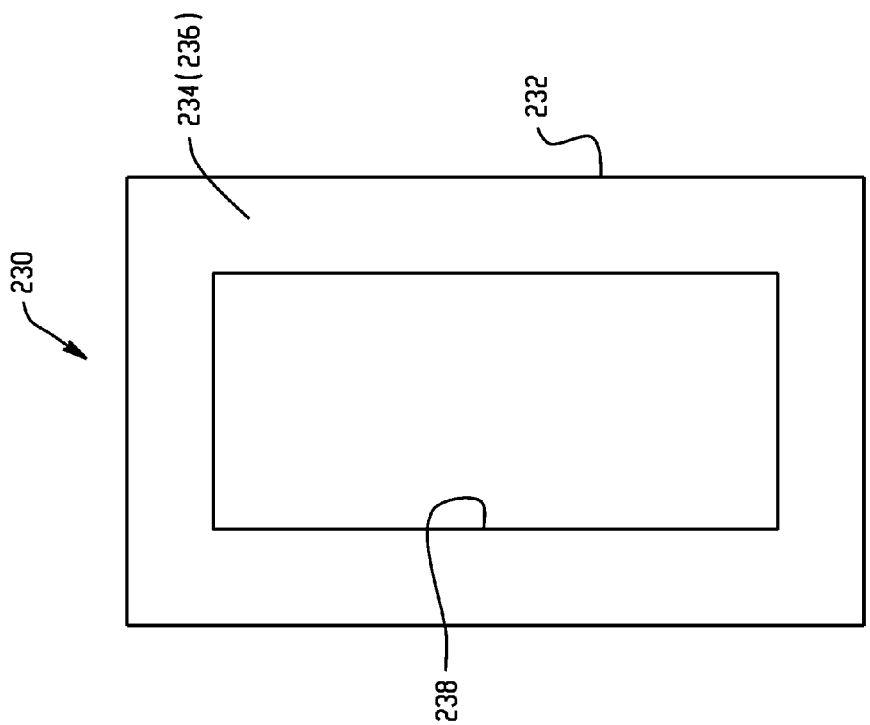
FIG. 6 is a plan view of an alternative frame seal used with the light emitting device of FIG. 1.

With continued reference to FIGS. 6 and 7, and additional reference to FIGS. 8-10, the frame seal 230 is folded along first and second sets of opposite edges of the frame seal. More particularly, sidewall portions 242 and cover portions 244 are formed along the first and second edges or, as illustrated along the right- and left-hand edges, by the first and second fold lines 246, 248 (FIG. 8). This permits the frame seal to be folded along the fold lines 246, 248 to enclose the first set of edges as shown in FIG. 9. In a similar fashion, sidewall portions 262 and cover portions 264 formed by the fold lines 266, 268 on the second set of edges of the frame seal (shown only in FIG. 9 for ease of illustration) are folded inwardly to result in the final structure exhibited in FIG. 10.

As will be appreciated, another distinction between the first and second embodiments is that the double thickness or folded regions of the perimeter seals are disposed on an opposite face of the light source assembly. That is, in the embodiment of FIGS. 1-5, the folds extend so that the cover portions 144, 164 reside along the first or light emitting surface 104. On the other hand, the cover portions 244, 264 of the frame seal 230 of the embodiment of FIGS. 6-10 are disposed along the second or rear surface 106 of the light emitting device. Whereas in the embodiment of FIGS. 1-5 the backsheet can be purposefully oversized and advantageously used as an enhanced perimeter or edge seal (with or without an adhesive), the second embodiment of FIGS. 6-10 sandwiches the OLED device between the backsheet and the UHB film. The frame seal is a separate component that is assembled in a similar manner, i.e., by folding the edges over perimeter portions of the OLED device, the UHB film, and backsheet. Again, an adhesive may also be used on conjunction with the frame seal along the folded edges of the seal in a manner akin to that shown and described with reference to FIGS. 1-5.

The seal 130, 230 is preferably formed of a material impervious to moisture and oxygen. Since the seal material does not interfere with the light emitting region of the light source assembly, the material can also be opaque, although the seal material does not have to be opaque.

Still another feature is that the seal 130, 230 or adhesive 138 may include a moisture absorbing material, sometimes referred to as a getter, or a desiccant in the adhesive along the edge seal. Such a feature would further enhance the oxygen or moisture impermeable properties of the edge seal structure.

The width of the edge seal, or what can also be referenced as the diffusion path length, is an important factor in the shelf life of the OLED. By essentially doubling the diffusion path length with one of the preferred embodiments of the present disclosure, oxygen and moisture have to travel this extended length to react with the OLED. The increased diffusion path length provided by the edge seal is achieved with the same physical edge seal width of prior arrangements. As noted, this implicates shelf life of the OLED, and the fill factor for tiled panels (fill factor is the proportion of light emitting area to dark area). In summary, the present disclosure doubles the diffusion path length and improves the shelf life while maintaining the same fill factor.

It will be appreciated that electricity is provided to the OLED device via an electrical feedthrough in the edge seal, or via an electrical feedthrough through the face of the backsheet, or in other ways known in the art. Since these features do not form a particular part of the present disclosure, no further description thereof is deemed necessary to a full and complete understanding of the present disclosure.

The disclosure has been described with respect to preferred embodiments. Obviously, modifications, alterations, and associated benefits may be contemplated by one skilled in the art. For example, small molecules that are outgassed from adhesives can potentially damage the OLED device. Therefore, by having some of the seal external to the OLED device, this issue can be effectively addressed. Further, the edge seal can wrap around to seal to the top side of an OLED device fabricated on an ultra high barrier substrate. This is opposed to our preferred embodiment where the OLED device is manufactured on a regular plastic substrate, and then encapsulated with another film that has high barrier properties. The subject disclosure should not be limited to the particular examples described above but instead through the following claims.

What is claimed is:
1. A light source assembly comprising:
a flexible generally planar light emitting device that includes at least a cathode layer, an organic layer, and an anode layer having parallel, first and second generally planar surfaces the light emitting device received between a backsheet and an ultrahigh barrier; and
a seal extending over at least a portion of the first surface of the light emitting device, abutting the second surface of the light emitting device, and including a sidewall portion that encloses the perimeter of the light emitting device, the seal folded along edges thereof to form a generally quadrilateral conformation, first and second sets of opposite edges of the generally quadrilateral conformation having a single seal thickness and corner portions of the generally quadrilateral conformation having a seal triple thickness.

2. The light source assembly of claim 1 further comprising an adhesive interposed between the seal and the light emitting device along a perimeter.

3. The light source assembly of claim 2 wherein the adhesive is interposed between the seal and the first and second surfaces of the light emitting device adjacent a perimeter.

4. The light source assembly of claim 3 wherein the seal includes a cover portion that extends inwardly from the perimeter over the second surface of the light emitting device.

5. The light source assembly of claim 1 wherein the seal has a central opening.

6. The light source assembly of claim 5 wherein the central opening matches the light emitting portion of the first surface.

7. The light source assembly of claim 1 wherein the seal is formed of a material impermeable to moisture and oxygen.

8. The light source assembly of claim 1 wherein the seal includes a moisture absorbing material.

9. The light source assembly of claim 1 wherein the sidewall portion of the seal forms a generally U-shaped peripheral seal that extends around an entire perimeter of the light emitting device.

10. The light source assembly of claim 1 wherein the adhesive is continuous along the seal from the perimeter of the light emitting device to a terminal edge of the seal.

11. The light source assembly of claim 1 wherein the seal is continuous along the second surface, the perimeter, and extending over the first surface of the light emitting device.

12. The light source assembly of claim 11 wherein a barrier is interposed between the light emitting device and a terminal edge of the seal, and the terminal edge is adhesively secured to a barrier.

13. The light source assembly of claim 1 wherein the seal is a substantially annular-shaped component having an inner perimeter and an outer perimeter, the inner perimeter dimensioned for receipt over the first surface of the light emitting device so that the seal covers portions of the first surface adjacent a perimeter of the light emitting device.

14. An organic light emitting diode (OLED) device comprising:
    a flexible, substantially planar device having a perimeter and a light emitting first surface and a parallel, second surface; and
    a seal extending about the perimeter and along the first surface around a light emitting portion thereof, the seal has a central opening along the second surface of the light emitting device, and extends over only a marginal portion of the first surface of the light emitting device, and the seal being folded along edges thereof to form a generally quadrilateral conformation, a first set of opposite edges of the generally quadrilateral conformation has a seal single thickness and a second set of opposite edges of the generally quadrilateral conformation has a seal triple thickness.

15. The OLED device of claim 14 wherein the seal extends along the second surface.

16. The OLED device of claim 15 wherein the seal is a backsheet that entirely covers the second surface.

17. The OLED device of claim 14 wherein the light emitting planar device is received between a backsheet and an ultrahigh barrier (UHB).

18. The light source assembly of claim 2 wherein the adhesive has a thickness along a perimeter of the light emitting device disposed between the first and second surfaces that is substantially the same as a thickness of the light emitting device.

* * * * *